United States Patent
Guo et al.

(10) Patent No.: US 12,153,099 B2
(45) Date of Patent: Nov. 26, 2024

(54) SHIELDING DETECTION CIRCUIT OF TRANSMISSION LINE AND TRANSMISSION LINE SYSTEM

(71) Applicant: Guangdong Rifeng Electric Cable Co., Ltd., Zhongshan (CN)

(72) Inventors: Lanwang Guo, Zhongshan (CN); Daijun Jiang, Zhongshan (CN)

(73) Assignee: Guangdong Rifeng Electric Cable Co., Ltd., Zhongshan (CN)

( * ) Notice: Subject to any disclaimer, the term of this patent is extended or adjusted under 35 U.S.C. 154(b) by 41 days.

(21) Appl. No.: 17/962,373

(22) Filed: Oct. 7, 2022

(65) Prior Publication Data
US 2024/0053413 A1    Feb. 15, 2024

(30) Foreign Application Priority Data

Aug. 15, 2022   (CN) .......................... 202210978867.9

(51) Int. Cl.
*G01R 31/58*    (2020.01)
*G01R 31/08*    (2020.01)
*G01R 31/52*    (2020.01)

(52) U.S. Cl.
CPC ........... *G01R 31/58* (2020.01); *G01R 31/085* (2013.01); *G01R 31/52* (2020.01)

(58) Field of Classification Search
CPC ....... G01R 31/58; G01R 31/52; G01R 31/085
See application file for complete search history.

(56) References Cited

U.S. PATENT DOCUMENTS

| 11,287,459 | B2 * | 3/2022 | Ren .................. G01R 31/085 |
| 2023/0420159 | A1 * | 12/2023 | Li ...................... H01B 9/006 |

FOREIGN PATENT DOCUMENTS

CN    209515273    * 10/2019

* cited by examiner

*Primary Examiner* — Reena Aurora
(74) *Attorney, Agent, or Firm* — The Webb Law Firm (57) ABSTRACT

Disclosed are a shielding detection circuit of a transmission line and a transmission line system. The shielding detection circuit of the transmission line includes an electric leakage detection module, a breakage detection module, a switch module and a control module, and a detection end of the electric leakage detection module is connected with a conducting shielding layer set to detect an electric leakage signal. The breakage detection module includes a first detection end and a second detection end. The first detection end of the breakage detection module is connected with one end of the conducting shielding layer set and the second detection end of the breakage detection module is connected with the other end of the conducting shielding layer set to detect a breakage signal. The switch module is connected with a power supply bus set to switch an on-off state of a transmission line of the power supply bus set.

10 Claims, 4 Drawing Sheets

SHIELDING DETECTION CIRCUIT OF TRANSMISSION LINE AND TRANSMISSION LINE SYSTEM

CROSS-REFERENCE TO RELATED APPLICATION

This application claims priority to Chinese Patent Application No. 202210978867.9 filed Aug. 15, 2022, the disclosure of which is hereby incorporated by reference in its entirety.

BACKGROUND

Technical Field

The present disclosure relates to the technical field of cable equipment, and more particularly, to a shielding detection circuit of a transmission line and a transmission line system.

Technical Description

An existing power supply transmission line generally comprises a power supply bus and a conducting shielding layer sleeved on the power supply bus, wherein the conducting shielding layer is matched with an existing shielding detection circuit of a transmission line for use. The shielding detection circuit of the transmission line generally comprises an electric leakage detection module, a switch module and a control module, wherein the electric leakage detection module is electrically connected with the conducting shielding layer, the switch module is connected to the power supply bus to switch an on-off state of a transmission line of the power supply bus, the control module is electrically connected with the electric leakage detection module and the switch module respectively, and the control module is capable of controlling the switch module to turn on and off according to an electric leakage signal fed back by the electric leakage detection module. However, when breakage occurs in the conducting shielding layer, an electrical signal cannot be transmitted normally in the conducting shielding layer, and even if leakage occurs in some positions, the electric leakage signal cannot be transmitted to a connection point of the electric leakage detection module, thus greatly reducing a safety performance.

SUMMARY

The present disclosure aims to address at least one of the technical problems in the existing art. Therefore, the present disclosure provides a shielding detection circuit of a transmission line and a transmission line system, which can detect whether the transmission line leaks electricity, and can also respond in time when the conducting shielding layer set is broken and damaged to turn off the transmission line, thus improving a power supply safety performance.

A shielding detection circuit of a transmission line according to an embodiment in a first aspect of the present disclosure is applied to a power supply bus set sleeved with a conducting shielding layer set, the shielding detection circuit includes: an electric leakage detection module, a detection end of the electric leakage detection module is connected with the conducting shielding layer set to detect an electric leakage signal, and the electric leakage signal is used for representing an electric leakage situation of the power supply bus set and the conducting shielding layer set; a breakage detection module, the breakage detection module includes a first detection end and a second detection end, the first detection end of the breakage detection module is connected with one end of the conducting shielding layer set and the second detection end of the breakage detection module is connected with the other end of the conducting shielding layer set to detect a breakage signal, and the breakage signal is used for representing a breakage situation of the conducting shielding layer set; a switch module connected with the power supply bus set to switch an on-off state of a transmission line of the power supply bus set; and a control module, the control module is respectively connected with an output end of the electric leakage detection module, an output end of the breakage detection module and a controlled end of the switch module to control the switch module to turn off when one of the electric leakage signal and the breakage signal is received.

The shielding detection circuit of the transmission line according to the embodiment of the present disclosure at least has the following beneficial effects: in the shielding detection circuit of the transmission line according to the present disclosure, when the power supply bus set leaks electricity, the power supply bus set and the conducting shielding layer set may be communicated, so that the electric leakage detection module detects and generates the electric leakage signal, when the conducting shielding layer set is broken and damaged, even if the power supply bus set and the conducting shielding layer set may be communicated, a current may not be conducted to the electric leakage detection module, and moreover, the breakage detection module is connected to two ends of the conducting shielding layer set to be able to detect the breakage signal, and the control module controls the switch module to turn off when one of the electric leakage signal and the breakage signal is received, so as to turn off the transmission line, thus ensuring a power supply safety, and this design can respond in time when the leakage of the transmission line or the breakage damage of the conducting shielding layer set occurs to turn off the transmission line, thus improving a power supply safety performance.

In some embodiments of the present disclosure, the shielding detection circuit of the transmission line further includes an overvoltage detection module, the overvoltage detection module includes a sampling end set, the sampling end set of the overvoltage detection module is connected with the power supply bus set to detect an overvoltage signal, the overvoltage signal is used for representing that a transmission voltage of the power supply bus set is higher than an overvoltage threshold, an output end of the overvoltage detection module is connected with the control module, and the control module controls the switch module to turn off when one of the electric leakage signal, the breakage signal and the overvoltage signal is received.

In some embodiments of the present disclosure, the overvoltage detection module includes a voltage division unit and a judgment unit, an input end of the voltage division unit is connected with the power supply bus set, an output end of the voltage division unit is connected with an input end of the judgment unit, the judgment unit is configured for judging whether the transmission voltage is higher than the overvoltage threshold and correspondingly forming the overvoltage signal, and an output end of the judgment unit is connected with the control module.

In some embodiments of the present disclosure, the electric leakage detection module includes a rectification unit and an isolation unit, one phase of an alternating-current input end of the rectification unit is connected with the power supply bus set, the other phase of the alternating-current input end of the rectification unit is connected with the conducting shielding layer set, a direct-current output end of the rectification unit is connected with an input end of the isolation unit, and an output end of the isolation unit is connected with the control module.

In some embodiments of the present disclosure, the shielding detection circuit of the transmission line further includes a first voltage-reduction electricity acquisition module, an electricity acquisition end of the first voltage-reduction electricity acquisition module is connected with the power supply bus set, the isolation unit includes a photoelectric coupler U2, an input end of a light receptor of the photoelectric coupler U2 is connected with an output end of the first voltage-reduction electricity acquisition module, and an output end of the light receptor of the photoelectric coupler U2 is connected with the control module.

In some embodiments of the present disclosure, the shielding detection circuit of the transmission line further includes a second voltage-reduction electricity acquisition module, an electricity acquisition end of the second voltage-reduction electricity acquisition module is connected with the power supply bus set, an output end of the second voltage-reduction electricity acquisition module is connected with the conducting shielding layer set, the breakage detection module includes a comparison unit, the comparison unit includes a first detection end and a second detection end, the first detection end of the comparison unit is connected with one end of the conducting shielding layer set and the second detection end of the comparison unit is connected with the other end of the conducting shielding layer set, an output end of the comparison unit is connected with the control module, and the breakage signal is formed when voltages of the first detection end of the comparison unit and the second detection end of the comparison unit are different.

In some embodiments of the present disclosure, the comparison unit includes a switch tube Q3, a resistor R12, a resistor R13, a resistor R14, a diode D4 and a diode D3, one end of the resistor R12 is connected with one end of the conducting shielding layer set, the other end of the resistor R12 is connected with an input pole of the switch tube Q3, a controlled pole of the switch tube Q3 is connected with one end of the resistor R13, the other end of the resistor R13 is respectively connected with one end of the resistor R14 and the other end of the conducting shielding layer set, an output pole of the switch tube Q3 is connected with an anode of the diode D4, a cathode of the diode D4 is connected with the control module, the other end of the resistor R14 is connected with an anode of the diode D3, and a cathode of the diode D3 is connected with the power supply bus set.

In some embodiments of the present disclosure, the switch module includes a relay unit, the relay unit includes a relay switch and a relay coil capable of driving the relay switch to turn on and off, the relay switch is connected with the power supply bus set to switch the on-off state of the transmission line of the power supply bus set, the control module includes a switch tube Q1, the relay coil is connected with the switch tube Q1 to form at least a part of a driving power supply loop, the driving power supply loop is connected with the power supply bus set, and a controlled pole of the switch tube Q1 is respectively connected with the output end of the electric leakage detection module and the output end of the breakage detection module.

A transmission line system according to an embodiment in a second aspect of the present disclosure includes a shielding detection circuit and a power supply bus set, the power supply bus set is sleeved with a conducting shielding layer set; and the shielding detection circuit includes: an electric leakage detection module, a detection end of the electric leakage detection module is connected with the conducting shielding layer set to detect an electric leakage signal, and the electric leakage signal is used for representing an electric leakage situation of the power supply bus set and the conducting shielding layer set; a breakage detection module, the breakage detection module includes a first detection end and a second detection end, the first detection end of the breakage detection module is connected with one end of the conducting shielding layer set and the second detection end of the breakage detection module is connected with the other end of the conducting shielding layer set to detect a breakage signal, and the breakage signal is used for representing a breakage situation of the conducting shielding layer set; a switch module connected with the power supply bus set to switch an on-off state of a transmission line of the power supply bus set; and a control module, the control module is respectively connected with an output end of the electric leakage detection module, an output end of the breakage detection module and a controlled end of the switch module to control the switch module to turn off when one of the electric leakage signal and the breakage signal is received.

The transmission line system according to the embodiment of the present disclosure at least has the following beneficial effects: in the transmission line system, the power supply bus set realizes transmission of electric energy, when the power supply bus set leaks electricity, the power supply bus set and the conducting shielding layer set may be communicated, so that the electric leakage detection module detects and generates the electric leakage signal, when the conducting shielding layer set is broken and damaged, even if the power supply bus set and the conducting shielding layer set may be communicated, a current may not be conducted to the electric leakage detection module, and moreover, the breakage detection module is connected to two ends of the conducting shielding layer set to be able to detect the breakage signal, and the control module controls the switch module to turn off when one of the electric leakage signal and the breakage signal is received, so as to turn off the transmission line, thus ensuring a power supply safety, and this design can respond in time when the leakage of the transmission line or the breakage damage of the conducting shielding layer set occurs to turn off the transmission line, thus improving a power supply safety performance.

In some embodiments of the present disclosure, the power supply bus set includes a first bus and a second bus, the conducting shielding layer set includes a conducting first shielding layer and a conducting second shielding layer, the first shielding layer is sleeved on the first bus, the second shielding layer is sleeved on the second bus, the switch module is respectively connected with the first bus and the second bus to switch the on-off state of the transmission line of the first bus and the second bus, the detection end of the electric leakage detection module is connected with the first shielding layer or the second shielding layer, the first detection end of the breakage detection module is connected with one end of the first shielding layer, the second detection end of the breakage detection module is connected with one end of the second shielding layer, and the other end of the first shielding layer is connected with the other end of the second shielding layer.

Additional aspects and advantages of the present disclosure will be explained in part in the following description, which can become apparent from the following description or be understood through practice of the present disclosure.

BRIEF DESCRIPTION OF THE DRAWINGS

The above and/or additional aspects and advantages of the present disclosure can become apparent and easy to understand from the description of embodiments in conjunction with the following drawings, in which.

REFERENCE NUMERALS 100 refers to electric leakage detection module; 110 refers to rectification unit; 120 refers to isolation unit; 200 refers to breakage detection module; 300 refers to switch module; 310 refers to relay switch; 320 refers to relay coil; 400 refers to control module; 500 refers to overvoltage detection module; 510 refers to voltage division unit; 520 refers to judgment unit; 610 refers to first voltage-reduction electricity acquisition module; 620 refers to second voltage-reduction electricity acquisition module; 630 refers to light prompt module; 710 refers to first bus; 711 refers to first current-carrying core; 712 refers to first insulating layer; 720 refers to second bus; 721 refers to second current-carrying core; 722 refers to second insulating layer; 730 refers to first shielding layer; 740 refers to second shielding layer; 750 refers to protective sheath layer; 810 refers to non-woven fabric layer; 820 refers to wire body; 830 refers to conducting layer assembly; 831 refers to first conducting layer; 832 refers to second conducting layer; 910 refers to power supply bus set; and 920 refers to conducting shielding layer set.

DETAILED DESCRIPTION

The embodiments of the present disclosure will be described in detail hereinafter. Examples of the embodiments are shown in the drawings. The same or similar reference numerals throughout the drawings denote the same or similar elements or elements having the same or similar functions. The embodiments described below by reference to the drawings are exemplary and are intended only to explain the present disclosure and cannot be construed as limiting the present disclosure.

In the description of the present disclosure, it should be understood that the orientation or position relationship indicated by the terms "up", "down", "front", "rear", "left", "right", "vertical", "horizontal", "top", "bottom", "inside", "outside", and the like is based on the orientation or position relationship shown in the drawings, it is only for the convenience of description of the present disclosure and simplification of the description, and it is not to indicate or imply that the indicated device or element must have a specific orientation, and be constructed and operated in a specific orientation. Therefore, the terms should not be understood as limiting the present disclosure.

In the description of the present disclosure, several means one or more, a plurality of means more than two, greater than, less than, more than, and the like are understood as not including this number, while above, below, within, and the like are understood as including this number. If there is the description of first and second, it is only for the purpose of distinguishing technical features, and should not be understood as indicating or implying relative importance or implying the number of indicated technical features or implying the order of indicated technical features.

In the description of the present disclosure, it should be noted that the terms "installation", "connected" and "connection" should be understood in a broad sense unless otherwise clearly specified and defined. For example, they may be fixed connection, removable connection or integrated connection; may be mechanical connection or electrical connection; and may be direct connection, or indirect connection through an intermediate medium, and connection inside two elements. The specific meanings of the above terms in the present disclosure can be understood in a specific case by those of ordinary skills in the art.

As shown in FIG. 1 to FIG. 4, a shielding detection circuit of a transmission line according to an embodiment in a first aspect of the present disclosure is applied to a power supply bus set 910, and the power supply bus set 910 is sleeved with a conducting shielding layer set 920. The shielding detection circuit includes an electric leakage detection module 100, a breakage detection module 200, a switch module 300 and a control module 400. A detection end of the electric leakage detection module 100 is connected with the conducting shielding layer set 920 to detect an electric leakage signal, and the electric leakage signal is used for representing an electric leakage situation of the power supply bus set 910 and the conducting shielding layer set 920. The breakage detection module 200 includes a first detection end and a second detection end, the first detection end of the breakage detection module 200 is connected with one end of the conducting shielding layer set 920 and the second detection end of the breakage detection module 200 is connected with the other end of the conducting shielding layer set 920 to detect a breakage signal, and the breakage signal is used for representing a breakage situation of the conducting shielding layer set 920. The switch module 300 is connected with the power supply bus set 910 to switch an on-off state of a transmission line of the power supply bus set 910. The control module 400 is respectively connected with an output end of the electric leakage detection module 100, an output end of the breakage detection module 200 and a controlled end of the switch module 300 to control the switch module 300 to turn off when one of the electric leakage signal and the breakage signal is received.

Figure 3:
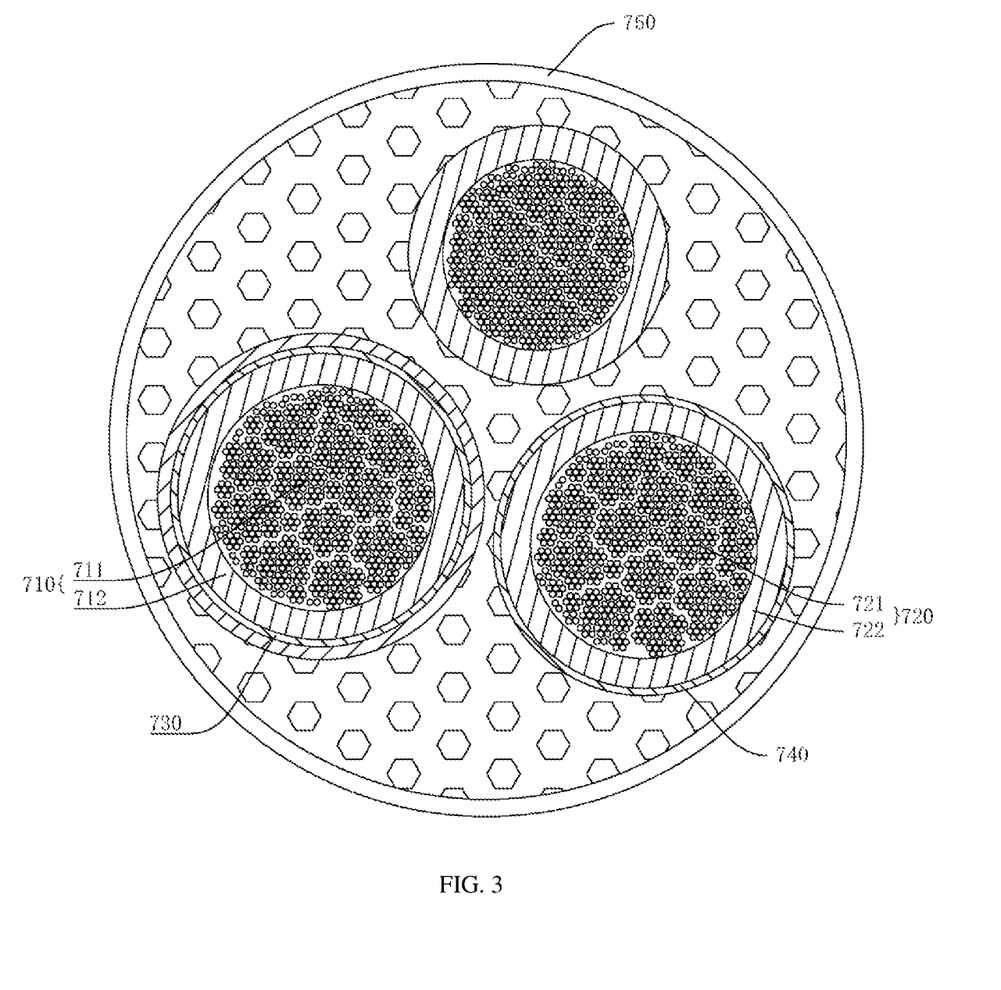
FIG. 3 is a schematic structural diagram of a cross section of a transmission line.

It should be noted that, as shown in FIG. 3, the transmission line has a length, the transmission line includes the power supply bus set 910 and the conducting shielding layer set 920, and the power supply bus set 910 and the conducting shielding layer set 920 are both arranged along a length direction of the transmission line.

Moreover, the power supply bus set 910 may be used for transmitting an alternating current, and the power supply bus set 910 includes a first bus 710 and a second bus 720. The conducting shielding layer set 920 includes a conducting first shielding layer 730 and a conducting second shielding layer 740, the first shielding layer 730 is sleeved on the first bus 710, and the second shielding layer 740 is sleeved on the second bus 720. The switch module 300 is respectively connected with the first bus 710 and the second bus 720 to switch the on-off state of the transmission line of the first bus 710 and the second bus 720. In some embodiments, the first bus 710 may be connected to an L phase of an alternating-current power supply, and the second bus 720 may be connected to an N phase of the alternating-current power supply.

Figure 1:
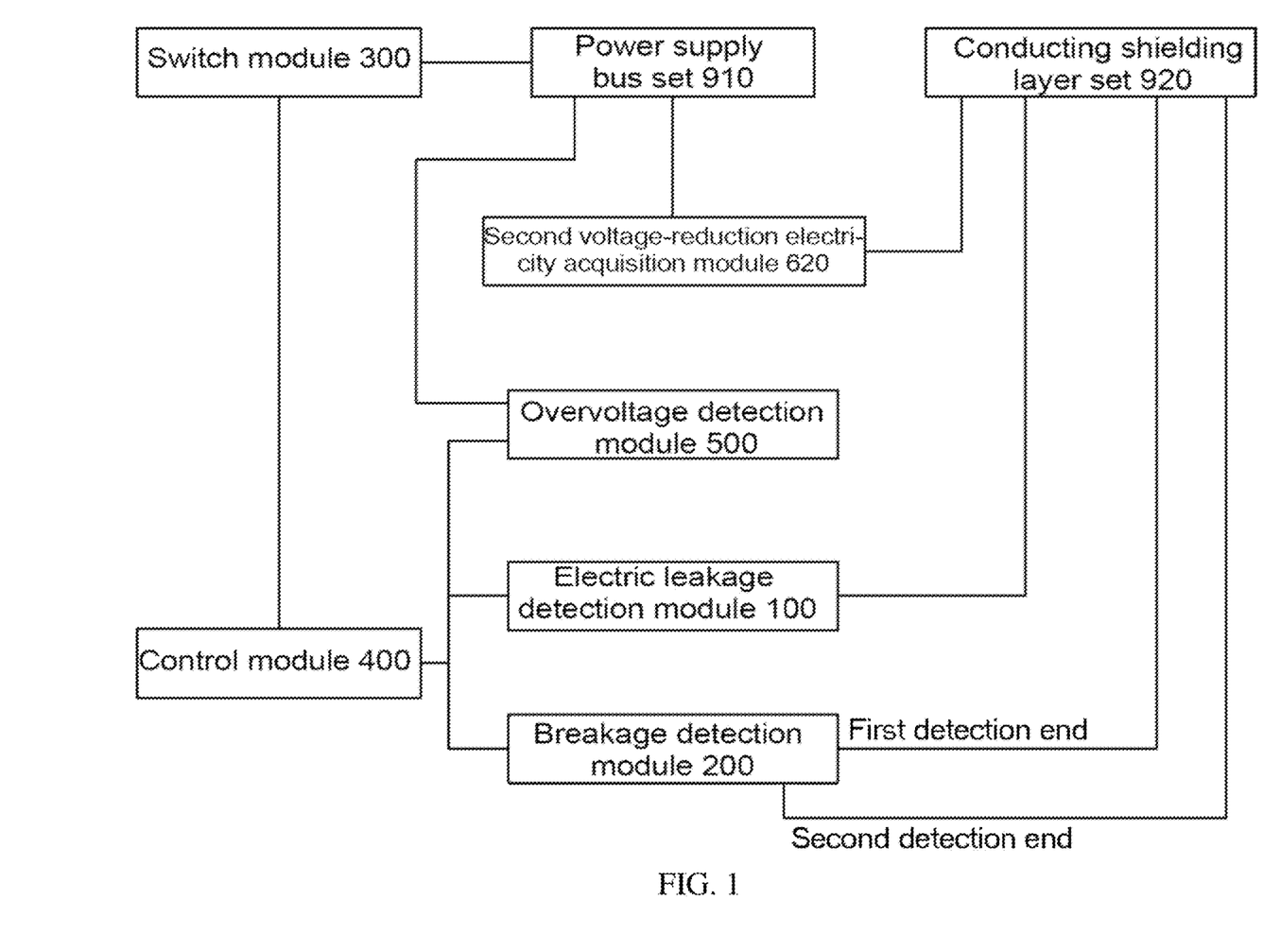
FIG. 1 is a block diagram of a structure of one embodiment of a shielding detection circuit according to the present disclosure.

In the shielding detection circuit of the transmission line according to the present disclosure, when the power supply bus set 910 leaks electricity, the power supply bus set 910 and the conducting shielding layer set 920 may be communicated, so that the electric leakage detection module 100 detects and generates the electric leakage signal, and when the conducting shielding layer set 920 is broken and damaged, even if the power supply bus set 910 and the conducting shielding layer set 920 may be communicated, a current may not be conducted to the electric leakage detection module 100. Moreover, the breakage detection module 200 is connected to two ends of the conducting shielding layer set 920 to be able to detect the breakage signal, and the control module 400 controls the switch module 300 to turn off when one of the electric leakage signal and the breakage signal is received, so as to turn off the transmission line, thus ensuring a power supply safety. This design can respond in time when the leakage of the transmission line or the breakage damage of the conducting shielding layer set 920 occurs to turn off the transmission line, thus improving a power supply safety performance.

Figure 2:
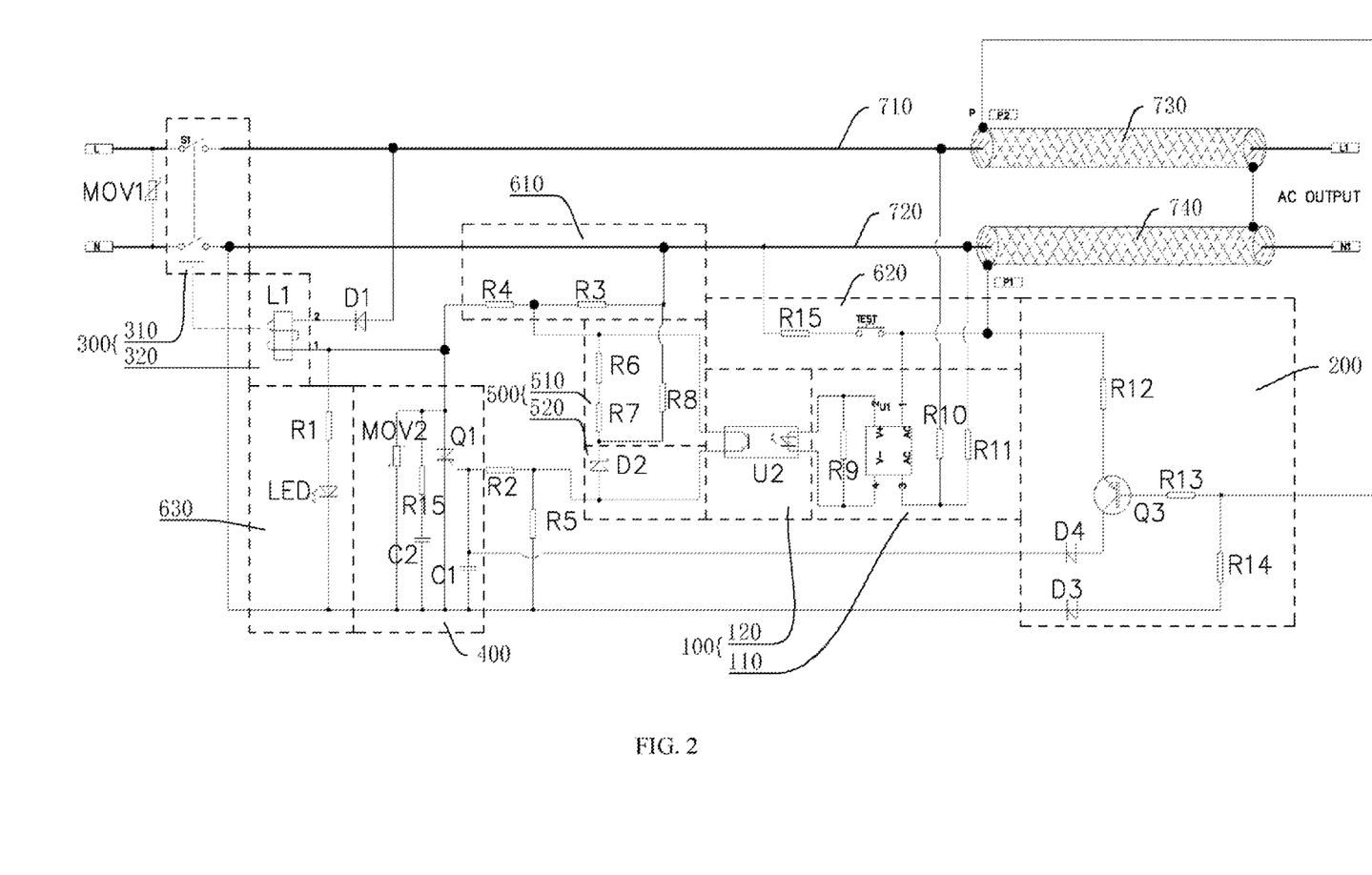
FIG. 2 is a schematic circuit diagram of one embodiment of the shielding detection circuit according to the present disclosure.

In some embodiments of the present disclosure, in order to prevent a transmission voltage of the power supply bus set 910 from being excessively high to damage an electricity load at a rear end, as shown in FIG. 1 and FIG. 2, the shielding detection circuit of the transmission line further includes an overvoltage detection module 500. The overvoltage detection module 500 includes a sampling end set, the sampling end set of the overvoltage detection module 500 is connected with the power supply bus set 910 to detect an overvoltage signal, and the overvoltage signal is used for representing that the transmission voltage of the power supply bus set 910 is higher than an overvoltage threshold. An output end of the overvoltage detection module 500 is connected with the control module 400, and the control module 400 controls the switch module 300 to turn off when one of the electric leakage signal, the breakage signal and the overvoltage signal is received. In some embodiments, the sampling end set includes a first sampling end and a second sampling end, the first sampling end of the overvoltage detection module 500 is connected with the first bus 710, and the second sampling end of the overvoltage detection module 500 is connected with the second bus 720.

In some embodiments of the present disclosure, the overvoltage detection module 500 includes a voltage division unit 510 and a judgment unit 520. An input end of the voltage division unit 510 is connected with the power supply bus set 910, an output end of the voltage division unit 510 is connected with an input end of the judgment unit 520, the judgment unit 520 is configured for judging whether the transmission voltage is higher than the overvoltage threshold and correspondingly forming the overvoltage signal, and an output end of the judgment unit 520 is connected with the control module 400.

The voltage division unit 510 is capable of reducing the transmission voltage of the power supply bus set 910, so as to facilitate judgment by the judgment unit 520. Moreover, the judgment unit 520 is provided with the overvoltage threshold, and when the transmission voltage is higher than the overvoltage threshold, the judgment unit 520 forms the overvoltage signal, which triggers the control module 400 to control the switch module 300 to turn off.

In some embodiments, the voltage division unit 510 may comprise a resistor R6 and a resistor R8, one end of the resistor R6 is connected with the first bus 710, and one end of the resistor R8 is connected with the second bus 720. The judgment unit 520 may comprise a voltage stabilizing tube D2, a cathode of the voltage stabilizing tube D2 is respectively connected with the other end of the resistor R6 and the other end of the resistor R8, and an anode of the voltage stabilizing tube D2 is connected with the control module 400. When a voltage output by the voltage division unit 510 is excessively high, the voltage stabilizing tube D2 is broken through, so as to form the overvoltage signal. In some embodiments, the overvoltage threshold may be set by a user by changing parameters of the voltage stabilizing tube D2 according to an actual situation.

In some embodiments of the present disclosure, as shown in FIG. 1 and FIG. 2, the electric leakage detection module 100 includes a rectification unit 110 and an isolation unit 120. One phase of an alternating-current input end of the rectification unit 110 is connected with the power supply bus set 910, the other phase of the alternating-current input end of the rectification unit 110 is connected with the conducting shielding layer set 920, a direct-current output end of the rectification unit 110 is connected with an input end of the isolation unit 120, and an output end of the isolation unit 120 is connected with the control module 400.

The rectification unit 110 may be selected from conventional full-bridge rectification or half-bridge rectification structures. When the power supply bus set 910 does not leak electricity, two phases of the alternating-current input end of the rectification unit 110 do not form a loop with the power supply bus set 910 and the conducting shielding layer set 920, so that the output end of the rectification unit 110 will not output a voltage, while when the power supply bus set 910 leaks electricity, two phases of the alternating-current input end of the rectification unit 110 form a loop with the power supply bus set 910 and the conducting shielding layer set 920, and the output end of the rectification unit 110 outputs a voltage. The isolation unit 120 is capable of isolating a signal to prevent the signal from interfering with the breakage signal and the overvoltage signal.

One phase of the alternating-current input end of the rectification unit 110 is respectively connected with one end of the resistor R10 and one end of the resistor R11, the other end of the resistor R10 is connected with the first bus 710, and the other end of the resistor R11 is connected with the second bus 720.

In some embodiments of the present disclosure, as shown in FIG. 2, the shielding detection circuit of the transmission line further includes a first voltage-reduction electricity acquisition module 610. An electricity acquisition end of the first voltage-reduction electricity acquisition module 610 is connected with the power supply bus set 910, the isolation unit 120 includes a photoelectric coupler U2, an input end of a light receptor of the photoelectric coupler U2 is connected with an output end of the first voltage-reduction electricity acquisition module 610, and an output end of the light receptor of the photoelectric coupler U2 is connected with the control module 400. An anode of a light emitter of the photoelectric coupler U2 is connected with an anode of the direct-current output end of the rectification unit 110, and a cathode of the light emitter of the photoelectric coupler U2 is connected with a cathode of the direct-current output end of the rectification unit 110.

In some embodiments, the first voltage-reduction electricity acquisition module 610 includes a resistor R3 and a resistor R4. One end of the resistor R3 is connected with the first bus 710, one end of the resistor R4 is connected with the first bus 710, the other end of the resistor R3 is respectively connected with the other end of the resistor R4 and the anode of the light emitter of the photoelectric coupler U2, and the cathode of the light emitter of the photoelectric coupler U2 is connected with the control module 400 and outputs the electric leakage signal.

In some embodiments of the present disclosure, as shown in FIG. 2, the shielding detection circuit of the transmission line further includes a second voltage-reduction electricity acquisition module 620. An electricity acquisition end of the second voltage-reduction electricity acquisition module 620 is connected with the power supply bus set 910, and an output end of the second voltage-reduction electricity acquisition module 620 is connected with the conducting shielding layer set 920. The breakage detection module 200 includes a comparison unit, the comparison unit includes a first detection end and a second detection end, the first detection end of the comparison unit is connected with one end of the conducting shielding layer set 920 and the second detection end of the comparison unit is connected with the other end of the conducting shielding layer set 920, an output end of the comparison unit is connected with the control module 400, and the breakage signal is formed when voltages of the first detection end of the comparison unit and the second detection end of the comparison unit are different.

The second voltage-reduction electricity acquisition module 620 may provide a low voltage for the conducting shielding layer set 920. It should be noted that the voltage threshold of the electric leakage detection module 100 may be set. Since a voltage transmitted by the power supply bus set 910 is high, the voltage may be higher than the voltage threshold of the electric leakage detection module 100 when leakage occurs, while the conducting shielding layer set 920 has a low voltage when no leakage occurs, but the low voltage is lower than the voltage threshold of the electric leakage detection module 100, so that the electric leakage detection module 100 may not form the electric leakage signal.

When breakage occurs at any point between two ends of the conducting shielding layer set 920, since the first detection end and the second detection end of the comparison unit are respectively connected to two ends of the conducting shielding layer set 920, there is a difference between voltages at one end of the conducting shielding layer set 920 close to a connection point at the output end of the second voltage-reduction electricity acquisition module 620 and one end of the conducting shielding layer set 920 far away from the connection point at the output end of the second voltage-reduction electricity acquisition module 620, so that the comparison unit may form the breakage signal.

In some embodiments of the present disclosure, the comparison unit includes a switch tube Q3, a resistor R12, a resistor R13, a resistor R14, a diode D4 and a diode D3. One end of the resistor R12 is connected with one end of the conducting shielding layer set 920, the other end of the resistor R12 is connected with an input pole of the switch tube Q3, a controlled pole of the switch tube Q3 is connected with one end of the resistor R13, the other end of the resistor R13 is respectively connected with one end of the resistor R14 and the other end of the conducting shielding layer set 920, an output pole of the switch tube Q3 is connected with an anode of the diode D4, a cathode of the diode D4 is connected with the control module 400, the other end of the resistor R14 is connected with an anode of the diode D3, and a cathode of the diode D3 is connected with the power supply bus set 910.

The switch tube Q3 may be selected from a triode, a MOS transistor and other elements according to an actual situation. In some embodiments, as shown in FIG. 2, the switch tube Q3 may be a PNP triode, and the other end of the resistor R14 may be connected with the first bus 710 or connected with the second bus 720. Moreover, the output end of the second voltage-reduction electricity acquisition module 620 is connected to a position close to one end of the conducting shielding layer set 920. When the conducting shielding layer set 920 is broken, a voltage on a base electrode side of the switch tube Q3 is lowered, and the switch tube Q3 is turned on, so as to form the breakage signal.

In some embodiments, the second voltage-reduction electricity acquisition module 620 includes a resistor R5. One end of the resistor R5 is connected with the first bus 710 or the second bus 720, and the other end of the resistor R5 is respectively connected with the conducting shielding layer set 920 and the input pole of the switch tube Q3. It should be noted that a resistance value of the resistor R5 herein is generally large, and a voltage level of the conducting shielding layer set 920 is insufficient to trigger the electric leakage detection module 100 to generate the electric leakage signal.

In some embodiments, the second voltage-reduction electricity acquisition module further includes a control switch test, and the other end of the resistor R5 is connected with the conducting shielding layer set 920 and the input pole of the switch tube Q3 through the control switch test. The user may decide whether to implement breakage detection on the conducting shielding layer set 920 by changing an on-off state of the control switch test.

In some embodiments of the present disclosure, the switch module 300 includes a relay unit, the relay unit includes a relay switch 310 and a relay coil 320 capable of driving the relay switch 310 to turn on and off, and the relay switch 310 is connected with the power supply bus set 910 to switch the on-off state of the transmission line of the power supply bus set 910. The control module 400 includes a switch tube Q1, the relay coil 320 is connected with the switch tube Q1 to form at least a part of a driving power supply loop, the driving power supply loop is connected with the power supply bus set 910, and a controlled pole of the switch tube Q1 is respectively connected with the output end of the electric leakage detection module 100 and the output end of the breakage detection module 200.

Two relay switches 310 may be provided, which are connected to the first bus 710 and the second bus 720 in one-to-one correspondence, and the relay switches 310 may be in a normally off state. When one of the electric leakage signal, the breakage signal or the overvoltage signal is generated, the control module 400 may control the relay coil 320 to be electrified, and the relay coil 320 may drive the relay switches 310 to turn off.

The switch tube Q1 may be a triode, a MOS transistor or a silicon controlled rectifier. In some embodiments, one end of the driving power supply loop is connected with the first bus 710, and the other end of the driving power supply loop is connected with the second bus 720. The controlled pole of the switch tube Q1 is electrified to turn on the switch tube Q1 and turn on the driving power supply loop, and the relay coil 320 is electrified to turn off the relay switches 310.

In some embodiments of the present disclosure, the shielding detection circuit of the transmission line further includes a light prompt module 630, and the light prompt module 630 is connected in parallel with the switch tube Q1. When the transmission line normally transmits electric energy, the switch tube Q1 is in an off state, and the light prompt module 630 lights up. When the transmission line leaks electricity or the conducting shielding layer set 920 is broken, the switch tube Q1 is turned off, and the light prompt module 630 is short-circuited and extinguished. The user may know a transmission situation of the transmission line according to the on-off state of the light prompt module 630. In some embodiments, the light prompt module 630 may be composed of a LED.

A transmission line system according to an embodiment in a second aspect of the present disclosure includes a shielding detection circuit and a power supply bus set 910, the power supply bus set 910 is sleeved with a conducting shielding layer set 920, a switch module 300 is connected with the power supply bus set 910 to switch an on-off state of a transmission line of the power supply bus set 910, and a control module 400 controls the switch module 300 to turn off when any one of an electric leakage signal or a breakage signal is received.

In the transmission line system of the present disclosure, the power supply bus set 910 realizes transmission of electric energy. During the transmission, when the power supply bus set 910 leaks electricity, the power supply bus set 910 and the conducting shielding layer set 920 may be communicated, so that an electric leakage detection module 100 detects and generates an electric leakage signal, and when the conducting shielding layer set 920 is broken and damaged, even if the power supply bus set 910 and the conducting shielding layer set 920 may be communicated, a current may not be conducted to the electric leakage detection module 100. Moreover, the breakage detection module 200 is connected to two ends of the conducting shielding layer set 920 to be able to detect a breakage signal, and the control module 400 controls the switch module 300 to turn off when one of the electric leakage signal and the breakage signal is received, so as to turn off the transmission line, thus ensuring a power supply safety. This design can respond in time when the leakage of the transmission line or the breakage damage of the conducting shielding layer set 920 occurs to turn off the transmission line, thus improving a power supply safety performance.

In some embodiments of the present disclosure, as shown in FIG. 3, the power supply bus set 910 may be applied to power supply transmission of an alternating-current power supply. The power supply bus set 910 includes a first bus 710 and a second bus 720, and the conducting shielding layer set 920 includes a conducting first shielding layer 730 and a conducting second shielding layer 740. The first shielding layer 730 is sleeved on the first bus 710, and the second shielding layer 740 is sleeved on the second bus 720. The switch module 300 is respectively connected with the first bus 710 and the second bus 720 to switch the on-off state of the transmission line of the first bus 710 and the second bus 720, a detection end of the electric leakage detection module 100 is connected with the first shielding layer 730 or the second shielding layer 740, a first detection end of the breakage detection module 200 is connected with one end of the first shielding layer 730, a second detection end of the breakage detection module 200 is connected with one end of the second shielding layer 740, and the other end of the first shielding layer 730 is connected with the other end of the second shielding layer 740.

The first bus 710 includes a first current-carrying core 711 and a first insulating layer 712 coated on an outer peripheral surface of the first current-carrying core 711, and the first shielding layer 730 is coated on an outer peripheral surface of the first insulating layer 712. The second bus 720 includes a second current-carrying core 721 and a second insulating layer 722 coated on an outer peripheral surface of the second current-carrying core 721, and the second shielding layer 740 is coated on an outer peripheral surface of the second insulating layer 722. The first shielding layer 730 is conductively connected with the second shielding layer 740.

The first current-carrying core 711 may be connected with an L phase of an alternating-current power supply, and the second current-carrying core 721 may be connected with an N phase of the alternating-current power supply. The first shielding layer 730 can shield electricity transmission of the first current-carrying core 711, and the second shielding layer 740 can shield electricity transmission of the second current-carrying core 721. Meanwhile, when the electricity transmission of the first current-carrying core 711 is subjected to leakage to the outside, a current may break through the first insulating layer 712 and then pass through the first shielding layer 730 to be transmitted to the shielding detection circuit. Similarly, when the electricity transmission of the second current-carrying core 721 is subjected to leakage to the outside, a current may break through the second insulating layer 722 and then pass through the second shielding layer 740 to be transmitted to the shielding detection circuit.

Both the first current-carrying core 711 and the second current-carrying core 721 may formed by twisting conducting filaments made of metal, such as copper and aluminum, or alloy.

In some embodiments of the present disclosure, both the first insulating layer 712 and the second insulating layer 722 may be made of plastic, rubber or an irradiated ethylene propylene material. In some embodiments, the plastic may be a PVC material, the rubber may be a CPE synthetic rubber material, and the irradiated ethylene-propylene material may be ethylene propylene diene monomer rubber. Compared with a traditional irradiated chlorinated polyethylene insulating material, the irradiated ethylene-propylene material has better insulation performance and waterproof performance.

It should be noted that the transmission line further includes a protective sheath layer 750, the first bus 710 and the second bus 720 are coated inside the protective sheath layer 750, and fillers may be arranged between the first bus 710 and the second bus 720 and between an interior of the protective sheath layer 750 and an outer wall of the first bus 710 or an outer wall of the second bus 720. In some embodiments, the fillers may be aramid fibers.

Figure 4:
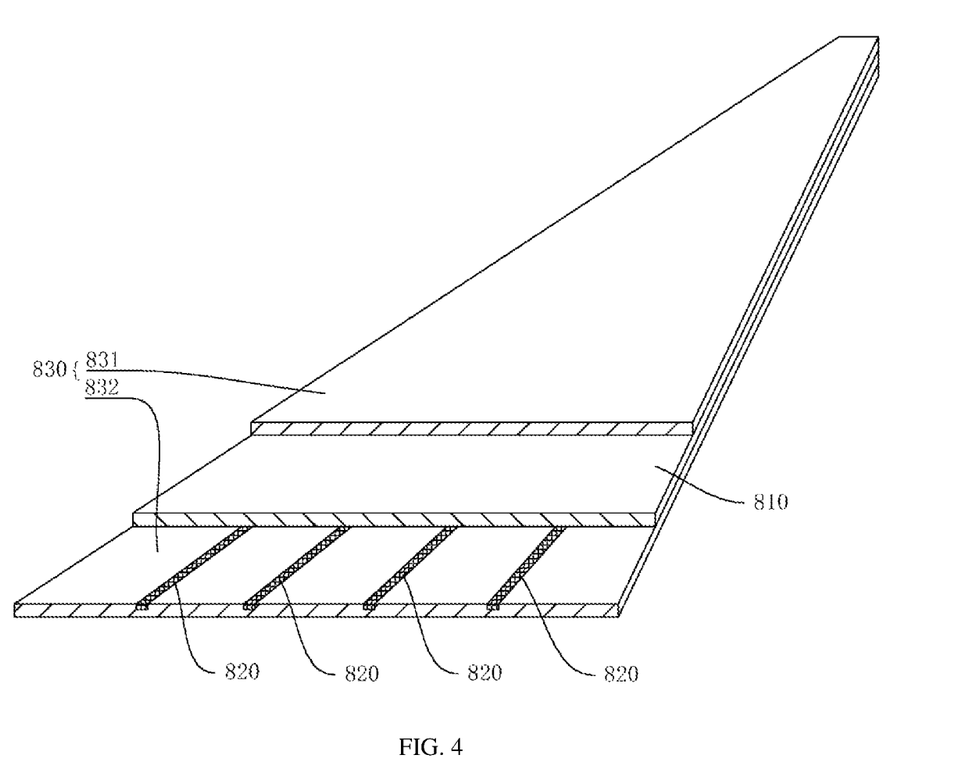
FIG. 4 is a schematic structural diagram of a first shielding layer.

Moreover, both the first shielding layer 730 and the second shielding layer 740 may be made of a composite conducting material. In some embodiments, as shown in FIG. 4, the composite conducting material includes a non-woven fabric layer 810, at least one wire body 820 and a non-metallic conducting layer assembly 830. The wire body 820 is arranged on at least one surface of the non-woven fabric layer 810, and the wire body 820 extends along a length direction of the non-woven fabric layer 810. The conducting layer assembly 830 covers at least one surface of the non-woven fabric layer 810, the wire body 820 is located between the conducting layer assembly 830 and the non-woven fabric layer 810, and the wire body 820 is conductively connected with the conducting layer assembly 830.

The non-woven fabric layer 810 is made of a polyester fiber (PET for short), which is also called a terylene fiber, and manufactured by a needle punching process, with a good toughness.

The wire body 820 may be a copper wire or an aluminum alloy wire, and a plurality of wire bodies 820 may be provided. In some embodiments, the non-woven fabric layer 810 is generally cut into strips, the wire bodies 820 extend along the length direction of the non-woven fabric layer 810, and the plurality of wire bodies 820 may be arranged at intervals along a width direction of the non-woven fabric layer 810, so that a control line connected with the shielding detection circuit is easily connected to end portions of the wire bodies 820.

In some embodiments of the present disclosure, the conducting layer assembly 830 is composed of one of superconducting graphene, superconducting carbon nanometer, superconducting graphite and superconducting carbon black.

The superconducting graphene, the superconducting carbon nanometer, the superconducting graphite and the superconducting carbon black are non-metallic superconducting materials, with a good conductivity. The conducting layer assembly 830 covers the wire body 820, so as to be tightly contacted with the wire body 820 to conduct electricity. In some embodiments, during production, the superconducting graphene, the superconducting carbon nanometer, the superconducting graphite and the superconducting carbon black are generally liquid slurries, which are soaked or coated on the surface of the non-woven fabric layer 810 and then solidified. The slurries of the superconducting graphene, the superconducting carbon nanometer, the superconducting graphite and the superconducting carbon black have a certain toughness after solidification, and under support of a non-woven fabric, the conducting layer assembly 830 is not easy to be broken during bending.

The non-woven fabric layer 810 has a good toughness, and the non-metallic conducting layer assembly 830 covers the non-woven fabric layer 810. When the composite conducting material is bent, the non-woven fabric layer 810 is not easy to be torn, and the conducting layer assembly 830 can be well supported at the same time, so that the conducting layer assembly 830 keeps a good conductivity, and the wire body 820 can also be tightly contacted with the conducting layer assembly 830. Therefore, an electrical signal induced by the conducting layer assembly 830 can be transmitted to the outside through the wire body 820.

In some embodiments of the present disclosure, the conducting layer assembly 830 includes a first conducting layer 831 and a second conducting layer 832, the first conducting layer 831 covers an upper surface of the non-woven fabric layer 810, the second conducting layer 832 covers a lower surface of the non-woven fabric layer 810, the wire body 820 is located between the second conducting layer 832 and the non-woven fabric layer 810, and the wire body 820 is conductively connected with the second conducting layer 832.

Generally speaking, the wire body 820 is arranged on one surface of the non-woven fabric layer 810, while the upper surface of the non-woven fabric layer 810 is covered with the first conducting layer 831 and the lower surface of the non-woven fabric layer 810 is covered with the second conducting layer 832, which can increase an overall strength of the composite conducting material. Meanwhile, the composite conducting material may be applied to form a shielding layer of a power line, so as to improve a shielding capability of the shielding layer against an electromagnetic interference signal and improve a leakage detection accuracy at the same time.

Various technical features of the above embodiments may be combined randomly, and in order to simplify the description, possible combinations of various technical features in the above embodiments are not all described. However, as long as the combinations of these technical features have no contradiction, the combinations of these technical features should be considered as falling into the scope recorded by the specification.

Although the embodiments of the present disclosure have been shown and described, those of ordinary skills in the art may understand that various changes, modifications, substitutions and variations may be made to these embodiments without departing from the principle and purpose of the present disclosure, and the scope of the present disclosure is defined by the claims and their equivalents.

What is claimed is:

1. A shielding detection circuit of a transmission line, applied to a power supply bus set sleeved with a conducting shielding layer set, wherein the shielding detection circuit of the transmission line comprises:
   an electric leakage detection module, wherein a detection end of the electric leakage detection module is connected with the conducting shielding layer set to detect an electric leakage signal, and the electric leakage signal is used for representing an electric leakage situation of the power supply bus set and the conducting shielding layer set;
   a breakage detection module, wherein the breakage detection module comprises a first detection end and a second detection end, the first detection end of the breakage detection module is connected with one end of the conducting shielding layer set and the second detection end of the breakage detection module is connected with the other end of the conducting shielding layer set to detect a breakage signal, and the breakage signal is used for representing a breakage situation of the conducting shielding layer set;
   a switch module connected with the power supply bus set to switch an on-off state of a transmission line of the power supply bus set; and
   a control module, wherein the control module is respectively connected with an output end of the electric leakage detection module, an output end of the breakage detection module and a controlled end of the switch module to control the switch module to turn off in response to one of the electric leakage signal and the breakage signal being received.

2. The shielding detection circuit of the transmission line according to claim 1, further comprising an overvoltage detection module, wherein the overvoltage detection module comprises a sampling end set, the sampling end set of the overvoltage detection module is connected with the power supply bus set to detect an overvoltage signal, the overvoltage signal is used for representing that a transmission voltage of the power supply bus set is higher than an overvoltage threshold, an output end of the overvoltage detection module is connected with the control module, and the control module is configured to control the switch module to turn off in response to one of the electric leakage signal, the breakage signal and the overvoltage signal being received.

3. The shielding detection circuit of the transmission line according to claim 2, wherein the overvoltage detection module comprises a voltage division unit and a judgment unit, an input end of the voltage division unit is connected with the power supply bus set, an output end of the voltage division unit is connected with an input end of the judgment unit, the judgment unit is configured for judging whether the transmission voltage is higher than the overvoltage threshold and correspondingly forming the overvoltage signal, and an output end of the judgment unit is connected with the control module.

4. The shielding detection circuit of the transmission line according to claim 1, wherein the electric leakage detection module comprises a rectification unit and an isolation unit, one phase of an alternating-current input end of the rectification unit is connected with the power supply bus set, the other phase of the alternating-current input end of the rectification unit is connected with the conducting shielding layer set, a direct-current output end of the rectification unit is connected with an input end of the isolation unit, and an output end of the isolation unit is connected with the control module.

5. The shielding detection circuit of the transmission line according to claim 4, further comprising a first voltage-reduction electricity acquisition module, wherein an electricity acquisition end of the first voltage-reduction electricity acquisition module is connected with the power supply bus set, the isolation unit comprises a photoelectric coupler U2, an input end of a light receptor of the photoelectric coupler U2 is connected with an output end of the first voltage-reduction electricity acquisition module, and an output end of the light receptor of the photoelectric coupler U2 is connected with the control module.

6. The shielding detection circuit of the transmission line according to claim 1, further comprising a second voltage-reduction electricity acquisition module, wherein an electricity acquisition end of the second voltage-reduction electricity acquisition module is connected with the power supply bus set, an output end of the second voltage-reduction electricity acquisition module is connected with the conducting shielding layer set, the breakage detection module comprises a comparison unit, the comparison unit comprises a first detection end and a second detection end, the first detection end of the comparison unit is connected with one end of the conducting shielding layer set and the second detection end of the comparison unit is connected with the other end of the conducting shielding layer set, an output end of the comparison unit is connected with the control module, and the breakage signal is formed in response to voltages of the first detection end of the comparison unit and the second detection end of the comparison unit being different.

7. The shielding detection circuit of the transmission line according to claim 6, wherein the comparison unit comprises a switch tube Q3, a resistor R12, a resistor R13, a resistor R14, a diode D4 and a diode D3, one end of the resistor R12 is connected with one end of the conducting shielding layer set, the other end of the resistor R12 is connected with an input pole of the switch tube Q3, a controlled pole of the switch tube Q3 is connected with one end of the resistor R13, the other end of the resistor R13 is respectively connected with one end of the resistor R14 and the other end of the conducting shielding layer set, an output pole of the switch tube Q3 is connected with an anode of the diode D4, a cathode of the diode D4 is connected with the control module, the other end of the resistor R14 is connected with an anode of the diode D3, and a cathode of the diode D3 is connected with the power supply bus set.

8. The shielding detection circuit of the transmission line according to claim 1, wherein the switch module comprises a relay unit, the relay unit comprises a relay switch and a relay coil capable of driving the relay switch to turn on and off, the relay switch is connected with the power supply bus set to switch the on-off state of the transmission line of the power supply bus set, the control module comprises a switch tube Q1, the relay coil is connected with the switch tube Q1 to form at least a part of a driving power supply loop, the driving power supply loop is connected with the power supply bus set, and a controlled pole of the switch tube Q1 is respectively connected with the output end of the electric leakage detection module and the output end of the breakage detection module.

9. A transmission line system, comprising a shielding detection circuit and a power supply bus set, wherein the power supply bus set is sleeved with a conducting shielding layer set; and
the shielding detection circuit comprises:
an electric leakage detection module, wherein a detection end of the electric leakage detection module is connected with the conducting shielding layer set to detect an electric leakage signal, and the electric leakage signal is used for representing an electric leakage situation of the power supply bus set and the conducting shielding layer set;
a breakage detection module, wherein the breakage detection module comprises a first detection end and a second detection end, the first detection end of the breakage detection module is connected with one end of the conducting shielding layer set and the second detection end of the breakage detection module is connected with the other end of the conducting shielding layer set to detect a breakage signal, and the breakage signal is used for representing a breakage situation of the conducting shielding layer set;
a switch module connected with the power supply bus set to switch an on-off state of a transmission line of the power supply bus set; and
a control module, wherein the control module is respectively connected with an output end of the electric leakage detection module, an output end of the breakage detection module and a controlled end of the switch module to control the switch module to turn off in response to one of the electric leakage signal and the breakage signal being received.

10. The transmission line system according to claim 9, wherein the power supply bus set comprises a first bus and a second bus, the conducting shielding layer set comprises a conducting first shielding layer and a conducting second shielding layer, the first shielding layer is sleeved on the first bus, the second shielding layer is sleeved on the second bus, the switch module is respectively connected with the first bus and the second bus to switch the on-off state of the transmission line of the first bus and the second bus, the detection end of the electric leakage detection module is connected with the first shielding layer or the second shielding layer, the first detection end of the breakage detection module is connected with one end of the first shielding layer, the second detection end of the breakage detection module is connected with one end of the second shielding layer, and the other end of the first shielding layer is connected with the other end of the second shielding layer.

* * * * *